United States Patent [19]

Matsushita et al.

[11] B 4,003,072
[45] Jan. 11, 1977

[54] SEMICONDUCTOR DEVICE WITH HIGH VOLTAGE BREAKDOWN RESISTANCE

[75] Inventors: Takeshi Matsushita, Sagamihara; Hisao Hayashi, Atsugi, both of Japan

[73] Assignee: Sony Corporation, Tokyo, Japan

[22] Filed: Nov. 1, 1974

[21] Appl. No.: 520,115

[44] Published under the second Trial Voluntary Protest Program on March 23, 1976 as document No. B 520,115.

Related U.S. Application Data

[63] Continuation of Ser. No. 351,172, April 17, 1973, abandoned.

[30] Foreign Application Priority Data

Apr. 20, 1972 Japan .............................. 47-39759

[52] U.S. Cl. .................................. 357/52; 357/13; 357/20; 357/34; 357/38
[51] Int. Cl.² ........................................ H01L 29/34
[58] Field of Search .................. 357/13, 20, 21, 22, 357/48, 52, 53, 68, 38, 34

[56] References Cited

UNITED STATES PATENTS

| 3,035,186 | 5/1962 | Doucette | 357/22 |
| 3,300,694 | 1/1967 | Stehney et al. | 357/20 |
| 3,335,296 | 8/1967 | Smart | 357/53 |
| 3,391,287 | 7/1968 | Kao et al. | 357/53 |
| 3,571,674 | 3/1971 | Yu et al. | 357/53 |
| 3,704,399 | 11/1972 | Glaise | 357/13 |

Primary Examiner—Andrew J. James
Assistant Examiner—Joseph E. Clawson, Jr.
Attorney, Agent, or Firm—Hill, Gross, Simpson, Van Santen, Steadman, Chiara & Simpson

[57] ABSTRACT

A semiconductor device including a substrate of semiconductor material having charge carriers of one conductivity type and a main region of opposite conductivity type. A ring of said opposite conductivity type is disposed around the main region and an auxiliary region of said opposite conductivity type is disposed on the opposite surface of the substrate. The said rings and the said auxiliary region are spaced from the main region by distances that permit the depletion region of the main region to reach the ring and the auxiliary region when the main region is reversed biased with respect to the substrate.

12 Claims, 9 Drawing Figures

SEMICONDUCTOR DEVICE WITH HIGH VOLTAGE BREAKDOWN RESISTANCE

This is a continuation, of application Ser. No. 351,172, filed Apr. 17, 1973 now abandoned.

BACKGROUND OF THE INVENTION

1. Field of the Invention

This invention relates in general to a semiconductor device and in particular to a planar-type device having an extremely high breakdown voltage characteristic.

2. Description of the Prior Art

A planar-type semiconductor junction device is disclosed in U.S. Pat. No. 3,555,373, which includes a so-called guard ring. A device of the type disclosed in this U.S. Pat. No. 3,555,373, having a guard ring, has a higher breakdown voltage characteristic than conventional planar devices. A structure of the type shown in this U.S. Pat. No. 3,555,373, however, is still inferior to so-called mesatype devices having a flat pn junction.

BRIEF SUMMARY OF THE INVENTION

The present invention provides a novel planar-type device which provides a much higher reverse breakdown voltage characteristic in a planar-type device than has heretofor been possible. In particular, it provides a structure having a further region on the opposite surface of the substrate of a planar-type pn junction device.

DETAILED DESCRIPTION

Figure 1:
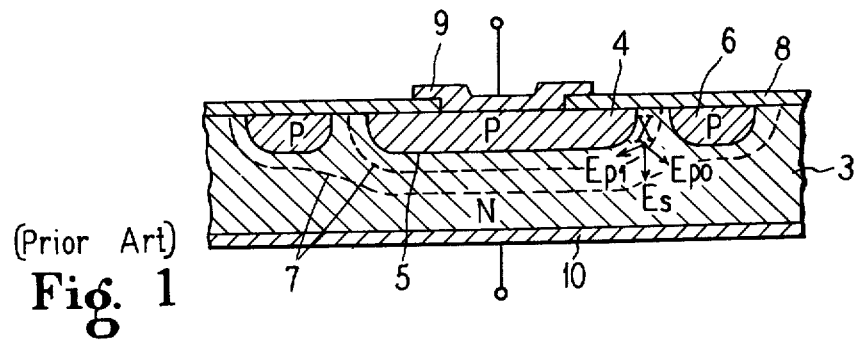
FIG. 1 diagrammatically illustrates a prior art type of a planar diode having a guard ring with no electrical connection to the guard ring.

FIG. 1 of the drawings illustrates a prior art form of device such as that described in U.S. Pat. No. 3,555,373. Specifically, there is shown in FIG. 1, a planar-type diode having a substrate 3 of semiconductor material with n-type impurity. Diffused into the upper surface of the substrate 3 is a p-type region 4 which forms a pn junction 5 with the substrate 3. It will be understood that the region 4 forms the anode and the region 3 the cathode of the diode. An anode electrode 9 is formed in contact with the region 4, while an ohmic contact 10 is provided on the under surface of the substrate 3. A guard ring 6 of p-type material is also diffused into the upper surface of the substrate 3 around the main region 4. There is no electrical connecton to this guard ring 6, but it will be appreciated that a pn junction is provided between the guard ring 6 and the substrate 3. An oxide coating 8 is preferably provided on the upper surface of the device.

When a negative voltage is applied to the diffused region 4, a depletion layer 7 extends from the region 4 and reaches the guard ring at a voltage which is lower than the breakdown voltage of the main pn junction 5. When a guard ring is provided to a planar device, the reverse breakdown voltage characteristic is improved because the curvature of the pn junction is moderated by the guard ring.

The device of FIG. 1 is inferior to a mesa-type device having a flat junction, insofar as its reverse voltage breakdown characteristic is concerned. For potential at an arbitrary point x (in FIG. 1) is a composite potential $E_s$, of the potential $E_{po}$ by the diffused region 4, and the potential $E_{pi}$ by the guard ring 6. As the voltage applied to the diffused region 4 increases, the potential difference between the region 4 and the ring 6 increases, and finally the device breaks down before the surface portion of the pn junction 5 breaks down.

Figure 2:
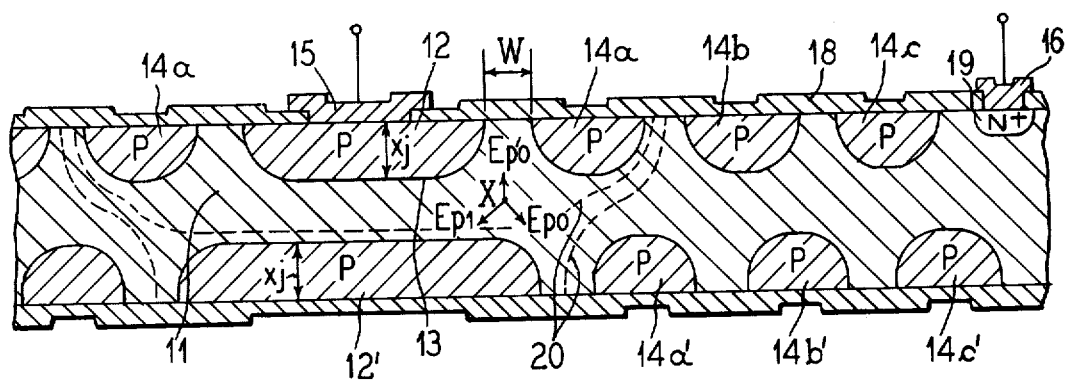
FIG. 2 is a fragmentary sectional view of a planar-type junction device having a plurality of guard rings on one surface, an auxiliary region on the opposite surface, and further guard rings around the auxiliary region.

One preferred embodiment of the present invention is shown in FIG. 2. Here a substrate 11 of n-type impurity silicon has diffused in the upper surface thereof a main region 12 and a plurality of guard rings 14a, 14b and 14c spaced therearound. An auxiliary region 12' of p-type impurity is diffused in the opposite surface of the substrate 11. This auxiliary region 12' is of larger diameter than the main region 12 for reasons which will hereinafter be made apparent. Also diffused into the upper surface of the substrate 11, are a plurality of guard rings of p-type impurity, 14a', 14b' and 14c'. These guard rings are spaced slightly laterally outwardly from the corresponding guard rings in the upper surface.

An anode electrode 15 is provided on the main region 12 and a cathode electrode 16 is provided as shown in FIG. 2, which connects to the substrate 11 through a high impurity concentration n+ region 19. This is provided for making an appropriate ohmic contact of the electrode 16 with the substrate 11.

The distance between the main region 12 and the guard rings 14a to 14c are selected to be predetermined values. The distance between the region 12 and the region 12' has also a predetermined value. As will be apparent from an inspection, the auxiliary region 12' is designed to have its edge portion offset with respect to the main region 12 (that is the reason auxiliary region 12' is larger than the main region 12). The auxiliary guard ring 14a' is offset with respect to the corresponding guard ring 14a. Similarly, the auxiliary guard rings 14b' and 14c' are offset with respect to the corresponding guard rings 14b and 14c respectively.

A depletion layer 20 will extend from the main region 12 and the guard ring 14a will reach the auxiliary region 12' before the pn junction 13 would break down, if the auxiliary region 12' were not provided. The potential at point x in FIG. 2 is a sum of three potentials, $E_{po}$ from the main region 12, $E_{p1}$ from the guard ring 14a, and $E_{p\ o}$ from the auxiliary region 12'. The composite potential becomes small because the potential $E_{p\ o}$ from the auxiliary region 12' is directed upwardly by reason that the auxiliary region 12' is larger than the main region 12. Thus, the depletion layer will expand from the main region 12 to the guard rings 14a to 14c, and to the auxiliary guard rings 14a' to 14c', hence the overall breakdown voltage becomes extremely high as is desired. The total breakdown voltage $V_B$ is described as follows:

$$V_B = n V_p + V \quad \text{where:}$$

$V_p$ is the punch through voltage between the main region 12 and the guard ring 14a or between the nearest guard rings, V is the breakdown voltage of the outermost guard ring, n is the number of guard rings.

By way of example, a device of this type might have the following physical dimensions:

$n = 15$;
diffusion depth $X_{j1} = 30$ microns;
thickness of the substrate $11 = 200$ microns with a resistivity of 120 ohm-cm.;
the distance W between the guard rings and between the main region 12 and the guard ring $14a = 130$ microns.

Figure 3:
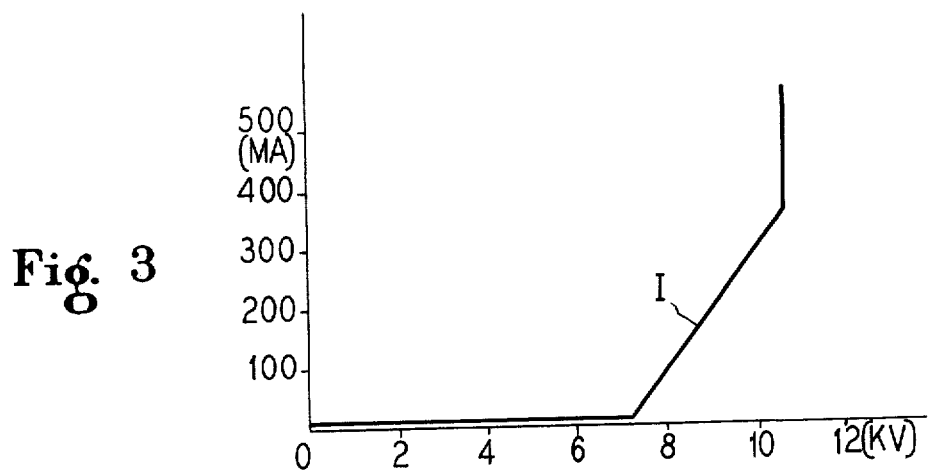
FIG. 3 is a diagram of the current-voltage characteristic of the device of FIG. 2.

With a construction of these characteristics and dimensions the device of FIG. 2 will have the charateristic as shown in FIG. 3. Here the breakdown voltage is about 7 kilovolts which is superior to that of a conventional mesa-type device (the conventional) mesa-type device usually being about 3 kilovolts).

Figure 4:
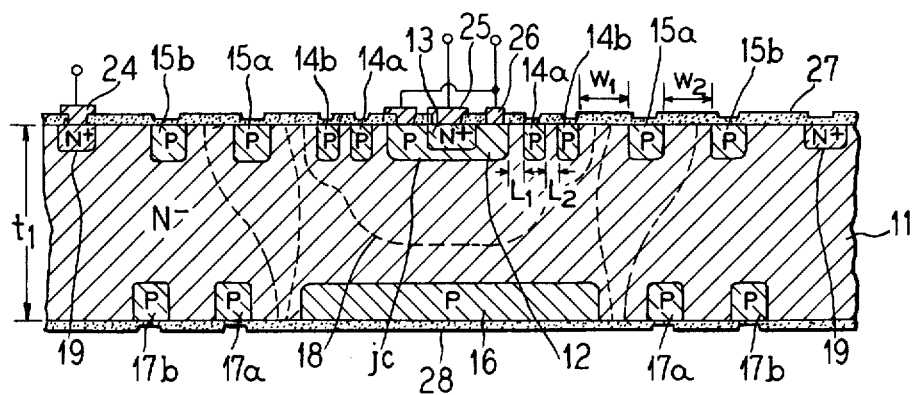
FIG. 4 diagrammatically shows a planar-type transistor having the present invention embodied therein.

FIG. 4 illustrates a planar-type transistor embodying the novel features of this invention. Here the emitter is provided by an n+ diffused region 13 which has been diffused into a p-type diffused base region 12, which in turn has been diffused into the substrate 11. The substrate 11, of course, forms the collector. A guard ring 14a is provided in the upper surface of p-type impurity and is so formed that the depletion layer 18 will reach the guard ring first, and then reach the auxiliary region 16 which has been diffused into the opposite surface of the substrate 11. An additional guard ring 14b surrounds the guard ring 14a in the upper surface, and two further guard rings 15a and 15b surround the guard ring 14b. Guard ring 14a is spaced relatively close to the region 12 this distance being specified in FIG. 4 as $L_1$. Guard ring 14b is separated from guard ring 14a by a similar distance $L_2$. Guard ring 15a is separated from guard ring 14a by a much wider distance, $W_1$. Guard ring 15b is also spaced from guard ring 15a by a distance $W_2$ as shown in the drawing. The depletion regions are shown by the broken lines in FIG. 4. The structure of FIG. 4 has an n+ diffused retion to facilitate an ohmic contact through an electrode 24 to the substrate 11. The emitter region 13 is provided with an electrode 25, as shown, and the base region 12 is also provided with an electrode 26, as shown. There are no electrodes to the auxiliary region 16, or to any of the guard rings. An oxide coating 27 is provided on the upper surface of the device, and an oxide coating 28 is provided on the lower surface of the device.

Figure 5:
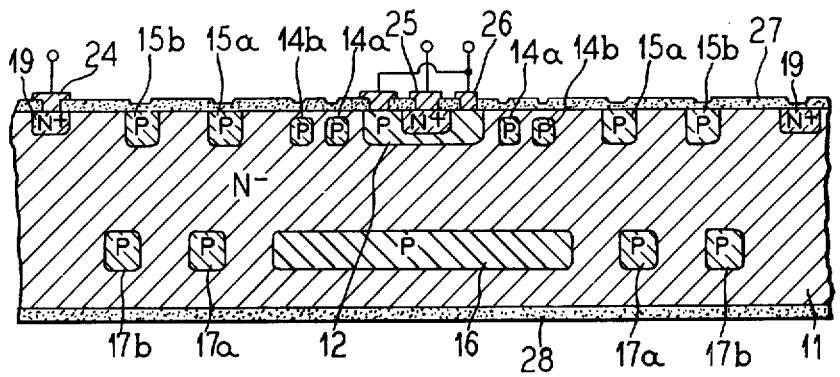
FIG. 5 is a view similar to FIG. 4, but showing a modification thereof.

FIG. 5 shows a variation of the structure shown in FIG. 4, but here the auxiliary region 16 and the auxiliary guard rings 17a and 17b are embedded in the substrate 11. In the structure of FIG. 5, the inner guard rings 14a and 14b surrounding the base region 12 are also embedded, as shown.

Figure 6:
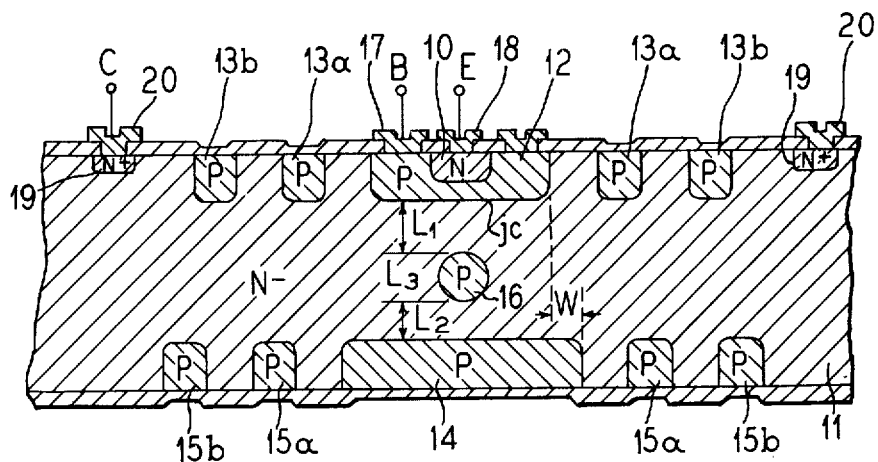
FIG. 6 is a diagrammatic view of another embodiment of the present invention applied to a transistor.

FIG. 6 shows a transistor with guard rings 13a and 13b and is generally similar to the structure shown in FIG. 2. Here, however, there is an intermediate region 16 of p-type impurity embedded in the substrate 11 between the region 12 and the region 14 but spaced therefrom. This easily extends the depletion layer from the base region 12 to the region 14.

Figure 7:
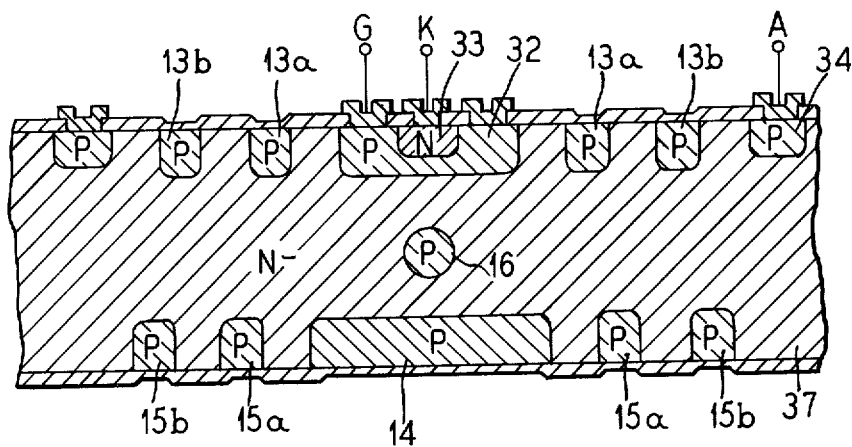
FIG. 7 is a diagrammatic view of a further embodiment of the present invention applied to a gate controlled switch.

FIG. 7 shows a device somewhat similar to FIG. 6, but is a gate controlled switch. The device includes the same guard rings as in FIG. 6, and the same intermediate region 16.

Figure 8:
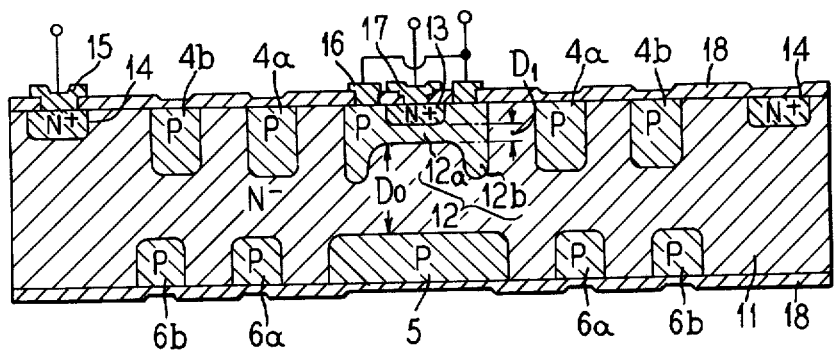
FIGS. 8 and 9 are diagrammatic views showing other embodiments of the present invention applied to a transistor and to a gate controlled switch, respectively.

FIG. 8 shows a transistor embodying the novel features of the present invention, the base region 12 of which includes a main portion 12a immediately below the emitter 13 and a downwardly extending peripheral portion 12b. This further enables the depletion layer to easily extend downwardly to the auxiliary region 5. The auxiliar region 5 has two guard rings 6a and 6b surrounding it. Two guard rings 4a and 4b surround the base region 12 in the manner and for the reasons hereinabove described in connection with previous embodiments. An oxide coating 18 is provided on the upper and lower surfaces of the device. Emitter electrode 17 is provided for the emitter region 13, while a base electrode 16 is provided for the base region 12. The collector region is provided with an electrode 15 which connects through the collector region through an n+ impurity region 14.

Figure 9:
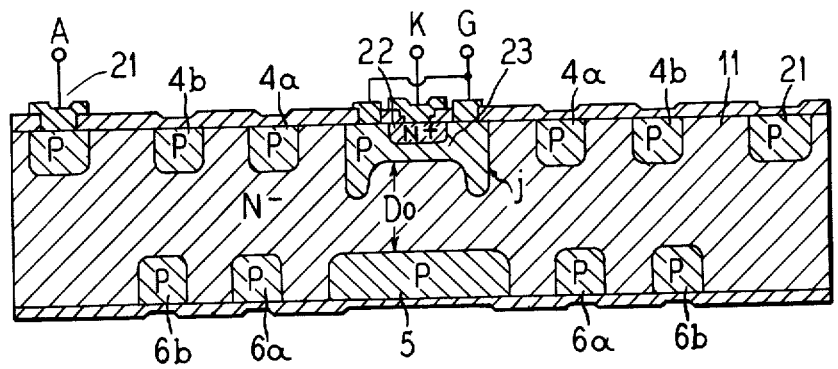

FIG. 9 is similar to FIG. 8, except that it is a gate controlled switch as distinct from a transistor. This will be apparent from an inspection of the arrangement of the electrodes 21, 22 and 23.

It will be well understood that many modifications and variations may be effected without departing from the spirit and scope of the novel concept of the present invention.

I claim as my invention:
1. A semiconductor device comprising:
   a planar substrate of semiconductor material of one conductivity type having first and second surfaces on opposite sides thereof;
   a first region of the opposite conductivity type on said first surface of said substrate forming a first pn junction therewith;
   a first electrode mounted on said first region;
   a second region of said opposite conductivity type on said first surface of said substrate forming a second pn junction therewith which surrounds said first pn junction in predetermined spaced relation;
   a third region of said opposite conductivity type on the second surface of said substrate forming a third pn junction therewith which faces said first region in predetermined spaced relation therewith; the periphery of said third region extending beyond that of said first region;
   said second and third regions being free of electrical connection;
   a potential source reverse biasing said first pn junction with a potential of such magnitude such that the depletion layer will extend from said first pn junction to said second and third pn junctions;
   a second electrode mounted on said substrate and disposed on a region of said one conductivity type on said first surface of said substrate, and the distance between said second electrode and said first region being larger than the distance between said first and second regions;
   said potential source connected to said first and second electrodes;
   said first, second and third regions being arranged so that a depletion layer extends from the vicinity of said first pn junction and surrounds said second and third regions so as to increase the breakdown voltage, and insulating layers covering said first and second surfaces.

2. A semiconductor device according to claim 1 including a fourth region of said one conductivity type formed in said first region of opposite conductivity type, and a third electrode connected to said fourth region.

3. A semiconductor device as in claim 1 which has a fourth region surrounded by the first region and a fifth region of said opposite conductivity type surrounding said second pn junction and first, second and third electrodes attached to said first, fourth and fifth regions.

4. A semiconductor device according to claim 1 including insulating layers coating said second and third regions.

5. A semiconductor device comprising
a planar substrate of semiconductor material of one conductivity type having first and second surfaces on opposite sides thereof;
a first region of the opposite conductivity type on said first surface of said substrate forming a first pn junction therewith;
a first electrode mounted on said first region;
a second region of said opposite conductivity type on said first surface of said substrate forming a second pn junction therewith which surrounds said first pn junction in predetermined spaced relation;
an embedded third region of said opposite conductivity type formed in said substrate between said second surface of said substrate and said first region and forming a third pn junction therewith which faces said first region in predetermined spaced relation therewith; the periphery of said third region extending beyond that of said first region;
said second and third regions being free of electrical connection;
a potential source reverse biasing said first pn junction with a potential of such magnitude such that the depletion layer extends from said first pn junction to said second and third pn junctions;
and a second electrode mounted on said substrate and disposed on a region of said one conductivity type of said first surface of said substrate, and the distance between said second electrode and said first region being larger than the distance between said first and second regions;
said potential source connected to said first and second electrodes;
said first, second and third regions being arranged so that a depletion layer extends from the vicinity of said first pn junction and surrounds said second and third regions and so as to increase the breakdown voltage; and
insulation layers covering said first and second surfaces.

6. A semiconductor device according to claim 5 including a fourth region of said one conductivity type formed in said first region of opposite conductivity type, and a third electrode connected to said fourth region.

7. A semiconductor device according to claim 6 wherein a fifth region of said opposite conductivity type is formed in the second surface of said substrate and forms a pn junction therewith and said fifth region being free of electrodes and facing said first region.

8. A semiconductor device according to claim 7 wherein said embedded third region is generally cylindrical in shape and has an axis corresponding to the height of said cylinder extending parallel to said first and second surfaces.

9. A semiconductor device as in claim 5 which has a fourth region of said one conductivity type surrounded by said first region and a fifth region of said opposite conductivity type surrounding said second pn junction and first, second and third electrodes attached to said first, fourth and fifth regions.

10. A semiconductor device comprising:
a planar substrate of semiconductor material of one conductivity type having first and second surfaces on opposite sides thereof;
a first region of the opposite conductivity type on said first surface of said substrate forming a first pn junction therewith;
a first electrode mounted on said first region;
a second region of said opposite conductivity type on said first surface of said substrate forming a second pn junction therewith which surrounds said first pn junction in predetermined spaced relation;
a third region of said opposite conductivity type on the second surface of said substrate forming a third pn junction therewith which faces said first region in predetermined spaced relation therewith; the periphery of said third region extending beyond that of said first region;
the surface of said first region which faces said third region being cupped shape;
said second and third regions being free of electrical connection;
a potential source reverse biasing said first pn junction with a potential of such magnitude such that the depletion layer extends from said first pn junction to said second and third pn junctions;
and a second electrode mounted on said substrate and disposed on a region of said one conductivity type on said first surface of said substrate, and the distance between said second electrode and said first region being larger than the distance between said first and second regions;
said potential source connected to said first and second electrodes;
said first, second and third regions being arranged so that a depletion layer extends from the vicinity of said first pn junction and surrounds said second and third regions and thus so as to increase the breakdown voltage; and
insulating layers covering said first and second surfaces.

11. A semiconductor device according to claim 10 including a fourth region of said one conductivity type formed in said first region of opposite conductivity type, and a third electrode connected to said fourth region.

12. A semiconductor device according to claim 10 including a fourth region surrounded by the first region and a fifth region of said opposite conductivity type surrounding said second pn junction and first, second and third electrodes attached to said first, fourth and fifth regions.

* * * * *